(12) United States Patent
Kasahara et al.

(10) Patent No.: US 12,264,224 B2
(45) Date of Patent: Apr. 1, 2025

(54) MALEIMIDE RESIN COMPOSITION, PREPREG, LAMINATED BOARD, RESIN FILM, MULTILAYER PRINTED WIRING BOARD, AND SEMICONDUCTOR PACKAGE

(71) Applicant: Showa Denko Materials Co., Ltd., Chiyoda-ku (JP)

(72) Inventors: Aya Kasahara, Chiyoda-ku (JP); Tomohiko Kotake, Chiyoda-ku (JP); Daisuke Fujimoto, Chiyoda-ku (JP)

(73) Assignee: RESONAC CORPORATION, Tokyo (JP)

( * ) Notice: Subject to any disclaimer, the term of this patent is extended or adjusted under 35 U.S.C. 154(b) by 643 days.

(21) Appl. No.: 17/621,498

(22) PCT Filed: Jun. 25, 2020

(86) PCT No.: PCT/JP2020/025028
§ 371 (c)(1),
(2) Date: Dec. 21, 2021

(87) PCT Pub. No.: WO2020/262537
PCT Pub. Date: Dec. 30, 2020

(65) Prior Publication Data
US 2022/0363850 A1    Nov. 17, 2022

(30) Foreign Application Priority Data

Jun. 25, 2019    (JP) .................. 2019-117606

(51) Int. Cl.
| | | |
|---|---|---|
| *C08J 5/24* | (2006.01) | |
| *B32B 15/14* | (2006.01) | |
| *B32B 15/20* | (2006.01) | |
| *C08C 19/22* | (2006.01) | |
| *C08F 222/40* | (2006.01) | |
| *C08F 279/02* | (2006.01) | |
| *C08F 285/00* | (2006.01) | |
| *C08J 5/18* | (2006.01) | |
| *C08L 51/04* | (2006.01) | |

(52) U.S. Cl.
CPC .............. *C08J 5/24* (2013.01); *B32B 15/14* (2013.01); *B32B 15/20* (2013.01); *C08C 19/22* (2013.01); *C08F 222/40* (2013.01); *C08F 279/02* (2013.01); *C08F 285/00* (2013.01); *C08J 5/18* (2013.01); *C08L 51/04* (2013.01); *C08J 2447/00* (2013.01); *C08J 2453/02* (2013.01); *C08L 2203/20* (2013.01); *H05K 2201/0145* (2013.01)

(58) Field of Classification Search
CPC ............................... C09C 19/22; C08F 279/02
See application file for complete search history.

(56) References Cited

U.S. PATENT DOCUMENTS

| | | | | |
|---|---|---|---|---|
| 4,229,550 | A * | 10/1980 | Jones | C08F 279/02 525/375 |
| 2010/0129676 | A1* | 5/2010 | Fujimoto | C08J 3/246 524/424 |
| 2010/0233495 | A1* | 9/2010 | Mizuno | H05K 1/0353 524/508 |
| 2014/0011962 | A1* | 1/2014 | He | C08C 19/22 525/375 |
| 2018/0037705 | A1* | 2/2018 | Zeng | H05K 1/0326 |

FOREIGN PATENT DOCUMENTS

| | | | | |
|---|---|---|---|---|
| CN | 107531991 | A | 1/2018 | |
| JP | H06-192322 | A | 7/1994 | |
| JP | H06-192478 | A | 7/1994 | |
| JP | 2010-280893 | A | 12/2010 | |
| JP | 2013-189664 | A | 9/2013 | |
| JP | 2013189644 | A * | 9/2013 | |
| JP | 2014-84413 | A | 5/2014 | |
| WO | WO-2007094359 | A1 * | 8/2007 | ............ C08J 3/243 |
| WO | WO-2020217678 | A1 * | 10/2020 | ............ B32B 15/08 |

OTHER PUBLICATIONS

Machine transaltion of WO 2020/217678 (no date).*
Machine translation of JP 2013-189644 (no date).*

* cited by examiner

*Primary Examiner* — Marc S Zimmer
(74) *Attorney, Agent, or Firm* — FITCH, EVEN, TABIN & FLANNERY, LLP

(57) ABSTRACT

The present invention relates to a maleimide resin composition including (A) at least one selected from the group consisting of a maleimide compound having two or more N-substituted maleimide groups and a derivative thereof; and (B) a modified conjugated diene polymer, the component (B) being one resulting from modification of (b1) a conjugated diene polymer having a vinyl group in the side chain with (b2) a maleimide compound having two or more N-substituted maleimide groups and also to a prepreg, a laminate, a resin film, a multilayer printed wiring board, and a semiconductor package, each using the foregoing maleimide resin composition.

19 Claims, No Drawings

MALEIMIDE RESIN COMPOSITION, PREPREG, LAMINATED BOARD, RESIN FILM, MULTILAYER PRINTED WIRING BOARD, AND SEMICONDUCTOR PACKAGE

CROSS-REFERENCE TO RELATED APPLICATIONS

This application is a U.S. national phase application filed under 35 U.S.C. § 371 of International Application No. PCT/JP2020/025028, filed Jun. 25, 2020, which claims priority from Japanese Application No. JP 2019-117606, filed Jun. 25, 2019, which are both incorporated herein by reference in their entireties.

TECHNICAL FIELD

The present invention relates to a maleimide resin composition, a prepreg, a laminate, a resin film, a multilayer printed wiring board, and a semiconductor package.

BACKGROUND ART

Signals used in mobile communication devices represented by a cell phone, base station apparatuses for them, network infrastructure devices, such as a server and a router, large-sized computers, and the like are being increased in the speed and capacity every year. In accordance with this situation, printed wiring boards to be mounted on these electronic devices are required to adapt to high-frequency signals, and a substrate material having excellent dielectric characteristics (low dielectric constant and low dielectric dissipation factor; hereinafter occasionally referred to as "high-frequency characteristics") in a high frequency range which enable reduction of a transmission loss is demanded. In recent years, as such applications that handle such high-frequency signals, not only in the above-mentioned electronic devices but also in the ITS field (in connection with automobiles and traffic systems) as well as in the field of indoor short-distance communications systems, practical use planning and practical realization of novel systems that handle high-frequency wireless signals are being promoted. In the future, low transmission-loss substrate materials are expected to be required for the printed wiring boards to be mounted on such devices.

Conventionally, for a printed wiring board required to have a low transmission loss, a thermoplastic polymer which is excellent in high frequency characteristics has been used. As the thermoplastic polymer, for example, ones not having a polar group in molecules, such as polyphenylene ether and polybutadiene, are effective for lowering the dielectric dissipation factor. However, such a thermoplastic polymer is low in compatibility with other resin, and therefore, there is involved a problem such that when formed into a resin composition, it is poor in handleability, such as occurrence of separation from another component.

As a method for improving the compatibility with a thermoplastic polymer, a method for modifying the thermoplastic polymer is investigated.

A problem of PTL 1 is to provide a thermosetting resin composition which has low dielectric dissipation factor and low thermal expansion and is excellent in wiring embedding and flatness. PTL 1 discloses a technique regarding a thermosetting resin composition including an inorganic filler (A) and a polyimide compound (B) having a structural unit derived from a maleimide compound (a1) having at least two N-substituted maleimide groups and a structural unit derived from a diamine compound (a2), in which an acid anhydride-modified polybutadiene-based elastomer is blended.

CITATION LIST

Patent Literature

PTL 1: JP 2018-012747 A

SUMMARY OF INVENTION

Technical Problem

The resin composition described in PTL 1 brings about such results that the dielectric characteristics are excellent in a high frequency band while improving the compatibility of the thermoplastic polymer. However, in recent years, substrate materials are required to be applicable for a fifth generation mobile communication system (5G) antenna that uses radio waves in the frequency band of over 6 GHz and a millimeter wave radar that uses radio waves in the frequency band of 30 to 300 GHz. To do so, the development of a resin composition in which the dielectric characteristics in a band of 10 GHz or higher are much more improved is needed. However, according to the technique of PTL 1, it was difficult to achieve a further improvement in dielectric characteristics while keeping various properties favorable.

In view of the foregoing present circumstances, a problem of the present invention is to provide a maleimide resin composition developing excellent dielectric characteristics in a high frequency band of 10 GHz or higher while having favorable heat resistance and low thermal expansion and having excellent handleability as well as a prepreg, a laminate, a resin film, a multilayer printed wiring board, and a semiconductor package, each using the foregoing maleimide resin composition.

Solution to Problem

In order to solve the aforementioned problem, the present inventors made extensive and intensive investigations. As a result, it has been found that the foregoing problem can be solved by the following present invention.

Specifically, the present invention relates to the following [1] to [15].

[1] A maleimide resin composition including
(A) at least one selected from the group consisting of a maleimide compound having two or more N-substituted maleimide groups and a derivative thereof; and
(B) a modified conjugated diene polymer,
the component (B) being one resulting from modification of (b1) a conjugated diene polymer having a vinyl group in the side chain with (b2) a maleimide compound having two or more N-substituted maleimide groups.

[2] The maleimide resin composition as set forth above in [1], wherein the component (B) has, in the side chain, a substituent (x) resulting from reaction between the vinyl group which the component (b1) has and the N-substituted maleimide group which the component (b2) has.

[3] The maleimide resin composition as set forth above in [2], wherein the substituent (x) is a group containing, as a structure derived from the component (b2), a structure represented by the following general formula (B-11) or (B-12):

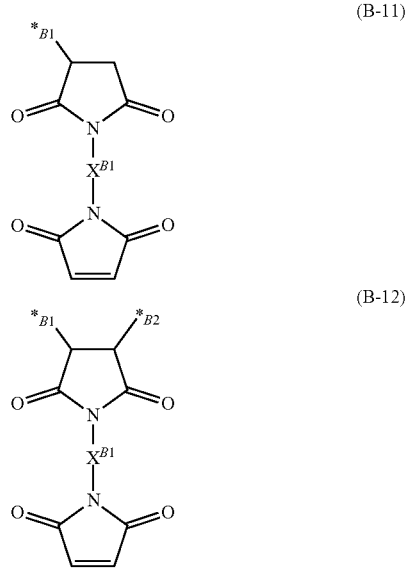

(B-11)

(B-12)

wherein $X^{B1}$ is a divalent organic group; $*^{B1}$ is a site binding with the carbon atom derived from the vinyl group which the component (b1) has in the side chain; and $*^{B2}$ is a site binding with other atom.

[4] The maleimide resin composition as set forth above in [2] or [3], wherein the component (B) has the substituent (x) and a vinyl group (y) in the side chain, and a ratio of the number of the substituent (x) relative to the total number of the substituent (x) and the substituent (y) contained in one molecule [x/(x+y)] is 0.01 to 0.5.

[5] The maleimide resin composition as set forth above in any of [1] to [4], wherein a number average molecular weight of the component (B) is 700 to 6,000.

[6] The maleimide resin composition as set forth above in any of 0.11 to [6], wherein the component (b1) is a polybutadiene having a 1,2-vinyl group.

[7] The maleimide resin composition as set forth above in [6], wherein the content of a structural unit having a 1,2-vinyl group is 50 mol % or more relative to the total structural units derived from butadiene constituting the polybutadiene having a 1,2-vinyl group.

[8] The maleimide resin composition as set forth above in any of [1] to [7], wherein the component (b2) is an aromatic bismaleimide compound substituted with an aliphatic hydrocarbon group.

[9] The maleimide resin composition as set forth above in any of [1] to [8], wherein a content ratio of the component (A) to the component (B) [(A)/(B)] is more than 1.0 on a mass basis.

[10] A prepreg formed by including the maleimide resin composition asset forth above in any of [1] to [9].

[11] A laminate formed by including the prepreg as set forth above in [10] and a metal foil.

[12] A resin film formed by including the maleimide resin composition as set forth above in any of [1] to [9].

[13] A multilayer printed wiring board formed by including at least one selected from the group consisting of the prepreg as set forth above in [10], the laminate as set forth above in [11], and the resin film as set forth above in [12].

[14] A semiconductor package formed by including a semiconductor device having the multilayer printed wiring board as set forth in [13] mounted thereon.

[15] A method for producing the maleimide resin composition as set forth above in any of [1] to [9], the method including the following steps 1 and 2:

Step 1: a step of allowing (b1) a conjugated diene polymer having a vinyl group in the side chain and (b2) a maleimide compound having two or more N-substituted maleimide groups to react with each other, to obtain (B) a modified conjugated diene polymer; and Step 2: a step of mixing (A) at least one selected from the group consisting of a maleimide compound having two or more N-substituted maleimide groups and a derivative thereof with the modified conjugated diene polymer (B).

Advantageous Effects of Invention

In accordance with the present invention, it is possible to provide a maleimide resin composition developing excellent dielectric characteristics in a high frequency band of 10 GHz or higher while having favorable heat resistance and low thermal expansion and having excellent handleability and also to provide a prepreg, a laminate, a resin film, a multilayer printed wiring board, and a semiconductor package, each using the foregoing maleimide resin composition.

DESCRIPTION OF EMBODIMENTS

In a numerical range described in this specification, the upper limit or the lower limit of the numerical range may be substituted by values shown in Examples. In addition, the upper limit or the lower limit of a numerical range are respectively appropriately combined with the lower limit or the upper limit of another numerical range.

Unless otherwise specified, components and materials exemplified in this specification may be used alone or may be used in combination of two or more thereof. In this specification, when plural substances corresponding to each component are present in a composition, the content of each component in the composition means a total amount of the plural substances present in the composition unless otherwise specified.

An aspect in which any items described in this specification are appropriately combined is encompassed in the present invention.

[Maleimide Resin Composition]

The maleimide resin composition of this embodiment [hereinafter occasionally abbreviated simply as "resin composition"] is a maleimide resin composition containing (A) at least one selected from the group consisting of a maleimide compound having two or more N-substituted maleimide groups and a derivative thereof [hereinafter occasionally abbreviated simply as "maleimide compound (A)" or "component (A)"]; and (B) a modified conjugated diene polymer [hereinafter occasionally abbreviated simply as "modified conjugated diene polymer (B)" or "component (B)"], the component (B) being one resulting from modification of (b1) a conjugated diene polymer having a vinyl group in the side chain [hereinafter occasionally abbreviated simply as "diene-based polymer (b1)" or "component (b1)"] with (b2) a maleimide compound having two or more N-substituted maleimide groups [hereinafter occasionally abbreviated simply as "maleimide compound (b2)" or "component (b2)"].

Although the reason why the maleimide resin composition of this embodiment develops excellent dielectric characteristics in a high frequency band of 10 GHz or higher while having favorable heat resistance and low thermal expansion and having excellent handleability is not elucidated yet, the following may be conjectured.

In view of the fact that the conjugated diene polymer does not contain a group having polarity in the molecule, it is effective for lowering the dielectric dissipation factor, whereas it is inferior in compatibility with the maleimide compound, and therefore, it is inferior in handleability, such as occurrence of separation. On the other hand, when an oxygen atom or the like is introduced into the conjugated diene polymer in order to improve this, an effect for lowering the dielectric dissipation factor becomes small. In contrast, as for the maleimide resin composition of this embodiment, as the conjugated diene polymer, one having a vinyl group in the side chain is adopted, and the vinyl group is allowed to react with the maleimide compound for modification in advance, whereby the compatibility of the conjugated diene polymer with the maleimide compound to be subsequently used as a main agent is improved. According to this, the maleimide resin composition of this embodiment is excellent in handleability.

Furthermore, this resin composition is not only excellent in compatibility but also excellent in heat resistance and thermal expansion coefficient, and the dielectric dissipation factor is unexpectedly lowered. It may be conjectured that this is caused due to the fact that when the conjugated diene polymer is compatibilized with the maleimide compound, the effect for lowering the dielectric dissipation factor is sufficiently exhibited, and in addition to that, the N-substituted maleimide group having been introduced into the conjugated diene polymer owing to the maleimide compound for modification reacts well with the maleimide compound to be subsequently used as a main agent, whereby the curability of the entire resin composition is improved.

The respective components are hereunder successively described in detail.

<Maleimide Compound (A)>

The maleimide compound (A) is at least one selected from the group consisting of a maleimide compound having two or more N-substituted maleimide groups and a derivative thereof.

Examples of the aforementioned "derivative of a maleimide compound having two or more N-substituted maleimide groups" include an addition reaction product between the aforementioned maleimide compound having two or more N-substituted maleimide groups and an amine compound, such as a diamine compound (a2) as mentioned later.

The component (A) may be used alone or may be used in combination of two or more thereof.

From the viewpoint of compatibility with other resin, adhesiveness to a conductor, and dielectric characteristics, the maleimide compound (A) is preferably at least one selected from the group consisting of (i) a maleimide compound (a1) having two or more N-substituted maleimide groups [hereinafter occasionally abbreviated simply as "maleimide compound (a1)" or "component (a1)"]; and (ii) a polyaminobismaleimide compound having a structural unit derived from the maleimide compound (a1) and a structural unit derived from a diamine compound (a2) [hereinafter occasionally abbreviated simply as "polyaminobismaleimide compound (A1)" or "component (A1)"].

(Maleimide Compound (a1))

Although the component (a1) is not particularly limited so long as it is a maleimide compound having two or more N-substituted maleimide groups, specific examples thereof include an aromatic maleimide compound having two N-substituted maleimide group in the molecule, such as bis(4-maleimidophenyl)methane, bis(4-maleimidophenyl)ether, bis(4-maleimidophenyl)sulfone, 3,3'-dimethyl-6,5'-diethyl-4,4'-diphenylmethane bismaleimide, 4-methyl-1,3-phenylene bismaleimide, m-phenylene bismaleimide, and 2,2-bis(4-(4-maleimidophenoxy)phenylapropane; an aromatic polymaleimide compound having three or more N-substituted maleimide groups in the molecule, such as polyphenylmethane maleimide and a biphenylaralkyl-type maleimide; and an aliphatic maleimide compound, such as 1,6-bismaleimido-(2,2,4-trimethyl)hexane and a pyrophosphoric acid binder-type long chain alkyl bismaleimide. Of these, from the viewpoint of compatibility with other resin, adhesiveness to a conductor, heat resistance, low thermal expansion, and mechanical characteristics, an aromatic maleimide compound having two N-substituted maleimide groups in the molecule and an aromatic polymaleimide compound having three or more N-substituted maleimide groups in the molecule are preferred, an aromatic polymaleimide compound having three or more N-substituted maleimide groups in the molecule is more preferred, and a biphenylaralkyl-type maleimide is still more preferred.

The component (a1) may be used alone or may be used in combination of two or more thereof.

As the component (a1), a bismaleimide compound represented by the following general formula (a1-1) is preferred.

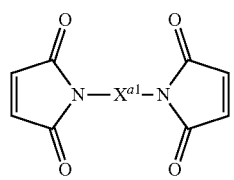

(a1-1)

In the formula, $X^{a1}$ is a divalent organic group.

$X^{a1}$ in the general formula (a1-1) is a divalent organic group and is corresponding to a residue of the component (a1). The residue of the component (a1) refers to a structure of a moiety of the component (a1) from which the N-substituted maleimide groups have been eliminated.

As the divalent organic group represented by $X^{a1}$, there is exemplified a group represented by the following general formula (a1-2), (a1-3), (a1-4), (a1-5), or (a1-6).

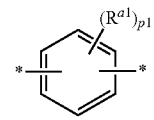

(a1-2)

In the formula, $R^{a1}$ is an aliphatic hydrocarbon group having 1 to 5 carbon atoms or a halogen atom; p1 is an integer of 0 to 4; and * indicates a binding site.

Examples of the aliphatic hydrocarbon group having 1 to 5 carbon atoms, which is represented by $R^{a1}$, include a methyl group, an ethyl group, a n-propyl group, an isopropyl group, a n-butyl group, an isobutyl group, a t-butyl group, and a n-pentyl group. The aliphatic hydrocarbon group may be an aliphatic hydrocarbon group having 1 to 3 carbon atoms, or may be a methyl group.

Examples of the halogen atom include a fluorine atom, a chlorine atom, a bromine atom, and an iodine atom.

p1 is an integer of 0 to 4, and from the viewpoint of easiness of availability, p1 may be an integer of 0 to 2, may be 0 or 1, or may be 0. In the case where p1 is an integer of 2 or more, plural $R^{a1}$'s may be the same as or different from each other.

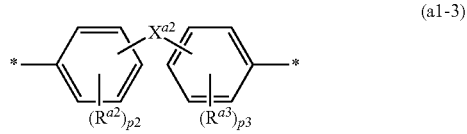

(a1-3)

In the formula, $R^{a2}$ and $R^{a3}$ are each independently an aliphatic hydrocarbon group having 1 to 5 carbon atoms or a halogen atom; $X^{a2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (a1-3-1); p2 and p3 are each independently an integer of 0 to 4; and * indicates a binding site.

Examples of the aliphatic hydrocarbon group having 1 to 5 carbon atoms and the halogen atom, which are represented by $R^{a2}$ and $R^{a3}$, include the same examples as in the case of $R^{a1}$. The aliphatic hydrocarbon group may be an aliphatic hydrocarbon group having 1 to 3 carbon atoms, may be a methyl group or an ethyl group, or may be an ethyl group.

Examples of the alkylene group having 1 to 5 carbon atoms, which is represented by $X^{a2}$, include a methylene group, a 1,2-dimethylene group, a 1,3-trimethylene group, a 1,4-tetramethylene group, and a 1,5-pentamethylene group. From the viewpoint of compatibility with other resin, adhesiveness to a conductor, heat resistance, low thermal expansion, and mechanical characteristics, the foregoing alkylene group may be an alkylene group having 1 to 3 carbon atoms, or may be a methylene group.

Examples of the alkylidene group having 2 to 5 carbon atoms, which is represented by $X^{a2}$, include an ethylidene group, a propylidene group, an isopropylidene group, a butylidene group, an isobutylidene group, a pentylidene group, and an isopentylidene group. Of these, from the viewpoint of compatibility with other resin, adhesiveness to a conductor, heat resistance, low thermal expansion, and mechanical characteristics, the foregoing alkylidene group may be an isopropylidene group.

Among the aforementioned options, $X^{a2}$ may be an alkylene group having 1 to 5 carbon atoms or an alkylidene group having 2 to 5 carbon atoms.

p2 and p3 are each independently an integer of 0 to 4, and from the viewpoint of easiness of availability, any of them may be an integer of 0 to 2, or may be 0 or 2. In the case where p2 or p3 is an integer of 2 or more, plural $R^{a2}$'s or plural $R^{a3}$'s may be the same as or different from each other.

The divalent group represented by the general formula (a1-3-1), which is represented by $X^{a2}$, is as follows.

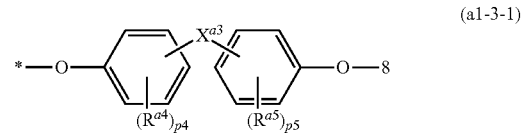

(a1-3-1)

In the formula, $R^{a4}$ and $R^{R5}$ are each independently an aliphatic hydrocarbon group having 1 to 5 carbon atoms or a halogen atom; $X^{a3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; p4 and p5 are each independently an integer of 0 to 4; and * indicates a binding site.

As the aliphatic hydrocarbon group having 1 to 5 carbon atoms and a halogen atom, which are represented by $R^{a4}$, and $R^{a5}$, the same explanation as in the case of $R^{a1}$ is made.

Examples of the alkylene group having 1 to 5 carbon atoms and the alkylidene group having 2 to 5 carbon atoms, which are represented by $X^{a3}$, include the same examples as in the alkylene group having 1 to 5 carbon atoms and the alkylidene group having 2 to 5 carbon atoms, which are represented by $X^{a2}$.

As $X^{a3}$, an alkylidene group having 2 to 5 carbon atoms may be selected from the aforementioned options.

p4 and p5 are each independently an integer of 0 to 4, and from the viewpoint of easiness of availability, any of them may be an integer of 0 to 2, may be 0 or 1, or may be 0. In the case where p4 or p5 is an integer of 2 or more, plural $R^{a4}$'s or plural $R^{a5}$'s may be the same as or different from each other.

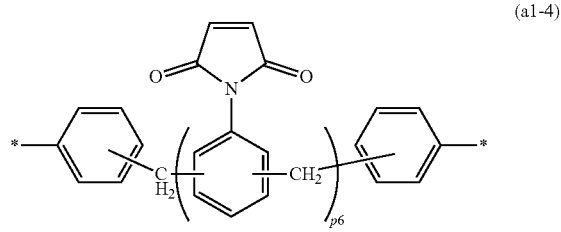

(a1-4)

In the formula, p6 is an integer of 0 to 10; and * indicates a binding site.

From the viewpoint of easiness of availability, p6 may be an integer of 0 to 5, or may be an integer of 0 to 3.

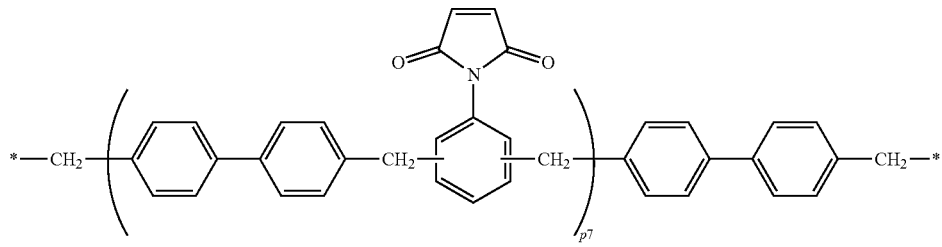

(a1-5)

In the formula, p7 is a number of 0 to 5; and * indicates a binding site.

(a1-6)

In the formula, $R^{a6}$ and $R^{a7}$ are each independently a hydrogen atom or an aliphatic hydrocarbon group having 1 to 5 carbon atoms; p8 is an integer of 1 to 8; and * indicates a binding site.

As the aliphatic hydrocarbon group having 1 to 5 carbon atoms, which are represented by $R^{a6}$ and $R^{a7}$, the same explanation as in the case of $R^{a1}$ is made.

p8 is an integer of 1 to 8, may be an integer of 1 to 3, or may be 1.

In the case where p8 is an integer of 2 or more, plural $R^{a6}$'s or plural $R^{a7}$'s may be the same as or different from each other.

(Polyaminobismaleimide Compound (A1))

The polyaminobismaleimide compound (A1) is a polyaminobismaleimide compound having a structural unit derived from the maleimide compound (a1) and a structural unit derived from the diamine compound (a2). The component (A1) may be used alone or may be used in combination of two or more thereof.

Examples of the structural unit derived from the component (a1) include at least one selected from the group consisting of a group represented by the following general formula (a1-7) and a group represented by the following general formula (a1-8).

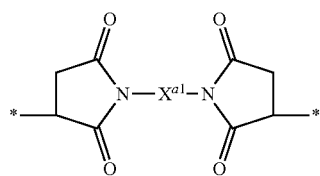

(a1-7)

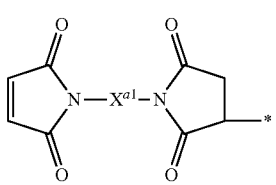

(a1-8)

In the formulae, $X^{a1}$ is a divalent organic group; and * indicates a binding position with other structure.

The explanation regarding $X^{a1}$ in the general formula (a1-7) and the general formula (a1-8) is the same as in the explanation regarding $X^{a1}$ in the general formula (a1-1).

The total content of the structural unit derived from the component (a1) in the polyaminobismaleimide compound (A1) is preferably 5 to 95% by mass, more preferably 30 to 93% by mass, still more preferably 60 to 90% by mass, and especially preferably 75 to 90% by mass. When the content of the structural unit derived from the component (a1) falls within the aforementioned range, there is a tendency that not only the dielectric characteristics in a high frequency band of 10 GHz or higher become more favorable, but also favorable film handling properties are obtained.

The component (a2) is not particularly limited so long as it is a compound having two amino groups.

Examples of the component (a2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis[1-[4-(4-aminophenoxy)phenyl]-1-methylethyl]benzene, 1,4-bis[1-[4-(4-aminophenoxy)phenyl]-1-methylethyl]benzene, 4,4'-[1,3-phenylene bis(1-methylethylidene)]bisaniline, 4,4'-[1,4-phenylene bis(1-methylethylidene)]bisaniline, 3,3'-[1,3-phenylene bis(1-methylethylidene)]bisaniline, bis[4-(4-aminophenoxy)phenyl] sulfone, bis[4-(3-aminophenoxy)phenyl] sulfone, and 9,9-bis(4-aminophenyl)fluorene.

The component (a2) may be used alone or may be used in combination of two or more thereof.

Of these, the component (a2) is preferably 4,4'-diaminodipbenylmethane, 4,4'-diamino-3,3'-dimethyldiphenylmethane, 4,4'-diamino-3,3'-diethyldiphenylmethane, 2,2-bis[4-(4-aminophenoxy)phenyl]propane, 4,4'-[1,3-phenylene bis(1-methylethylidene)]bisaniline, or 4,4'-[1,4-phenylene bis(1-methylethylidene)]bisaniline from the viewpoint that it is excellent in solubility in an organic solvent, reactivity with the component (a1), and heat resistance. The component (a2) is preferably 3,3'-dimethyl-5,5'-diethyl-4,4'-diaminodiphenylmethane from the viewpoint that it is excellent in dielectric characteristics and low water absorbency. The component (a2) is preferably 2,2-bis[4-(4-aminophenoxy)phenyl]propane from the viewpoint that it is excellent in high adhesiveness to a conductor and mechanical characteristics, such as elongation and breaking strength. Furthermore, the component (a2) is preferably 4,4'-[1,3-phenylene bis(1-methylethylidene)]bisaniline or 4,4'-[1,4-phenylene bis(1-methylethylidene)]bisaniline from the viewpoint that it is excellent in solubility in an organic solvent, reactivity at the time of synthesis, heat resistance, and high adhesiveness to a conductor, and in addition to that, it is excellent in dielectric characteristics and low hygroscopicity.

Examples of the structural unit derived from the component (a2) include at least one selected from the group consisting of a group represented by the following general formula (a2-1) and a group represented by the following general formula (a2-2).

(a2-1)

(a2-2)

In the formulae, $X^{a4}$ is a divalent organic group; and * indicates a binding position with other structure.

$X^{a4}$ in the general formulae (a2-1) and (a2-2) is a divalent organic group and is corresponding to a residue of the component (a2). The residue of the component (a2) refers to a structure of a moiety of the component (a2) from which the functional group provided for binding, namely an amino group has been eliminated.

$X^{a4}$ in the general formula (a2-1) and the general formula (a2-2) is preferably a divalent group represented by the following general formula (a2-3).

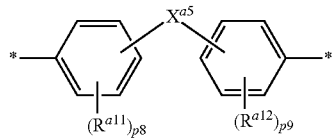
(a2-3)

In the formula, $R^{a11}$ and $R^{a12}$ are each independently an aliphatic hydrocarbon group having 1 to 5 carbon atoms, an alkoxy group having 1 to 5 carbon atoms, a hydroxy group, or a halogen atom; $X^{a5}$ is an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a divalent group represented by the following general formula (a2-3-1) or (a2-3-2); p8 and p9 are each independently an integer of 0 to 4; and * indicates a binding site.

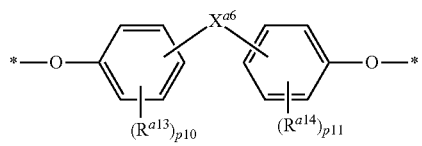
(a2-3-1)

In the formula, $R^{a13}$ and $R^{a14}$ are each independently an aliphatic hydrocarbon group having 1 to 5 carbon atoms or a halogen atom; $X^{a6}$ is an alkylene group having 1 to 5 carbon atoms, an alkylidene group having 2 to n carbon atoms, a m-phenylenediisopropylidene group, a p-phenylenediisopropylidene group, an ether group, a sulfide group, a sulfonyl group, a carbonyloxy group, a keto group, or a single bond; p10 and p11 are each independently an integer of 0 to 4; and * indicates a binding site.

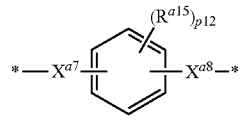
(a2-3-2)

In the formula, $R^{a15}$'s are each independently an aliphatic hydrocarbon group having 1 to 5 carbon atoms or a halogen atom; $X^{a7}$, and $X^{a8}$ are each independently an alkylene group having 1 to 5 carbon atoms, an alkylidene group having 2 to 5 carbon atoms, an ether group, a sulfide group, a sulfonyl group, a carbonyloxy group, a keto group, or a single bond; p12 is an integer of 0 to 4; and * indicates a binding site.

In the general formula (a2-3), (a2-3-1), or (a2-3-2), examples of the aliphatic hydrocarbon group having 1 to 5 carbon atoms or the halogen atom, which is represented by $R^{a11}$, $R^{a12}$, $R^{a13}$, $R^{a14}$, and $R^{a15}$, include the same examples as in $R^{a1}$ in the general formula (a1-2). The foregoing aliphatic hydrocarbon group may be an aliphatic hydrocarbon group having 1 to 3 carbon atoms, or may be a methyl group or an ethyl group.

As the alkylene group having 1 to 5 carbon atoms and the alkylidene group having 2 to 5 carbon atoms, which are represented by $X^{a5}$ in the general formula (a2-3), $X^{a6}$ in the general formula (a2-3-1), and $X^{a7}$ and $X^{a8}$ in the general formula (a2-3-2), the same explanation as in the case of $X^{a2}$ in the general formula (a1-3) is made.

p8 and p9 in the general formula (a2-3) are each independently an integer of 0 to 4, and from the viewpoint of easiness of availability, any of them may be an integer of 0 to 2, or may be 0 or 2. In the case where p8 or p9 is an integer of 2 or more, plural $R^{a11}$'s or plural $R^{a12}$'s may be the same as or different from each other.

p10 and p11 in the general formula (a2-3-1) are each independently an integer of 0 to 4, and from the viewpoint of easiness of availability, any of them may be an integer of 0 to 2, may be 0 or 1, or may be 0. In the case where p10 or p11 is an integer of 2 or more, plural $R^{a13}$'s or plural $R^{a14}$'s may be the same as or different from each other.

p12 in the general formula (a2-3-2) is an integer of 0 to 4, and from the viewpoint of easiness of availability, p12 may be an integer of 0 to 2, or may be 0. In the case where p12 is an integer of 2 or more, plural $R^{a15}$'s may be the same as or different from each other.

The total content of the structural unit derived from the component (a2) in the polyaminobismaleimide compound (A1) is preferably 5 to 95% by mass, more preferably 7 to 70% by mass, still more preferably 10 to 40% by mass, and especially preferably 10 to 26% by mass. When the total content of the structural unit derived from the component (a2) falls within the aforementioned range, there is a tendency that not only the dielectric characteristics are excellent, but also more favorable heat resistance, flame retardancy, and glass transition temperature are obtained.

The content ratio of the structural unit derived from the component (a1) and the structural unit derived from the component (a2) in the polyaminobismaleimide compound (A1) is a content ratio such that an equivalent ratio (Ta2/Ta1)

of a total equivalent (Ta2) of the —NH$_2$ group-derived group (also inclusive of —NH$_2$) of the component (a2) to a total equivalent (Ta1) of the N-substituted maleimide group-derived group (also inclusive of the N-substituted maleimide group) of the component (a1) in the polyaminobismaleimide compound (A1) is preferably 0.05 to 10, and more preferably 1 to 5. When the equivalent ratio (Ta2/Ta1) falls within the aforementioned range, there is a tendency that not only the dielectric characteristics are excellent, but also more favorable heat resistance, flame retardancy, and glass transition temperature are obtained.

From the viewpoint of dielectric characteristics as well as the viewpoint of solubility in an organic solvent, high adhesiveness to a conductor, moldability of a resin film, and so on, the polyaminobismaleimide compound (A1) preferably contains a polyaminobismaleimide compound represented by the following general formula (a2-4).

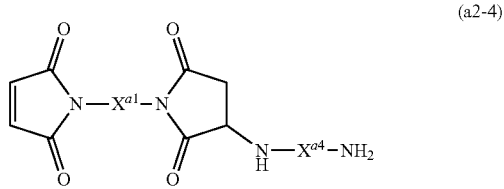

(a2-4)

In the formula, $X^{a1}$ and $X^{a4}$ are those as explained above.

(Production Method of Polyaminobismaleimide Compound (A1))

The component (A1) can be, for example, produced by allowing the component (a1) and the component (a2) to react with each other in an organic solvent.

On the occasion of allowing the component (a1) and the component (a2) to react with each other to produce the polyaminobismaleimide compound (A1), a reaction catalyst can be used, as required.

Although the reaction catalyst is not particularly limited, examples thereof include an acidic catalyst, such as p-toluenesulfonic acid; an amine, such as triethylamine, pyridine, and tributylamine; an imidazole, such as methylimidazole and phenylimidazole; and a phosphorus-based catalyst, such as triphenylphosphine. These may be used alone or may be used in combination of two or more thereof.

Although a blending amount of the reaction catalyst is not particularly limited, for example, the reaction catalyst may be used in an amount of 0.01 to 5 parts by mass relative to 100 parts by mass of a total amount of the component (a1) and the component (a2).

When predetermined amounts of the component (a1) and the component (a2), and optionally, another component are put in a synthetic tank, and the component (a1) and the component (a2) are subjected to a Michael addition reaction, the aforementioned polyaminobismaleimide compound is obtained. Although the reaction conditions in this step are not particularly limited, for example, from the viewpoint of workability, such as reaction rate, inhibition of gelling during the reaction, and so on, a reaction temperature is preferably 50 to 160° C., and a reaction time is preferably 1 to 10 hours.

In addition, in this step, the concentration of the solid components of reaction raw materials and the viscosity of the solution can be adjusted by addition of an organic solvent or by concentration. Although the concentration of the solid components of the reaction raw materials is not particularly limited, for example, it is preferably 10 to 90% by mass, and more preferably 20 to 80% by mass. When the concentration of the solid components of the reaction raw materials is 10% by mass or more, there is a tendency that the reaction rate does not become excessively slow, and such becomes advantageous in terms of the production cost. In addition, when the concentration of the solid components of the reaction raw materials is 90% by mass or less, there is a tendency that more favorable solubility is obtained, stirring efficiency becomes favorable, and gelling becomes difficult.

Although a number average molecular weight of the polyaminobismaleimide compound (A1) is not particularly limited, it is preferably 400 to 10,000, more preferably 500 to 5,000, still more preferably 600 to 2,000, and especially preferably 700 to 1,500.

The number average molecular weight in this specification means a value measured by gel permeation chromatography (GPO) as expressed in terms of polystyrene, and specifically, it can be measured by the method described in the section of Examples.

<Modified Conjugated Diene Polymer (B)>

The modified conjugated diene polymer (B) is one resulting from modification of (b1) a conjugated diene polymer having a vinyl group in the side chain with (b2) a maleimide compound having two or more N-substituted maleimide groups.

The component (B) may be used alone or may be used in combination of two or more thereof.

((b1) Conjugated Diene Polymer Having a Vinyl Group in the Side Chain)

Although the component (b1) is not particularly limited so long as it is a conjugated diene polymer having a vinyl group in the side chain, it is preferably a conjugated diene polymer having plural vinyl groups in the side chain.

The number of vinyl groups which the component (b1) has in one molecule thereof is preferably 3 or more, more preferably 5 or more, and still more preferably 10 or more from the viewpoint of dielectric characteristics and heat resistance.

The component (b1) may be used alone or may be used in combination of two or more thereof.

In this specification, the conjugated diene polymer means a polymer of a conjugated diene compound.

Examples of the conjugated diene compound include 1,3-butadiene, isoprene, 1,3-pentadiene, 2,3-dimethyl-1,3-butadiene, 2-phenyl-1,3-butadiene, and 1,3-hexadiene.

The conjugated diene polymer may be a polymer of a single conjugated diene compound or may be a polymer of two or more conjugated diene compounds.

The conjugated diene polymer may also be a copolymer of one or more conjugated diene compounds with one or more monomers other than the conjugated diene compound. In that case, the polymerization mode is not particularly limited, and it may be any of random polymerization, block polymerization, and graft polymerization.

Specific examples of the component (b1) include a polybutadiene having a 1,2-vinyl group, a butadiene-styrene copolymer having a 1,2-vinyl group, and a polyisoprene having a 1,2-vinyl group. Of these, from the viewpoint of dielectric characteristics and heat resistance, a polybutadiene having a 1,2-vinyl group and a butadiene-styrene copolymer having a 1,2-vinyl group are preferred, and a polybutadiene having a 1,2-vinyl group is more preferred. In addition, the polybutadiene having a 1,2-vinyl group is preferably a butadiene homopolymer having a 1,2-vinyl group.

The 1,2-vinyl group derived from butadiene, which the component (b1) has, is a vinyl group contained in the butadiene-derived structural unit represented by the following formula (b1-1).

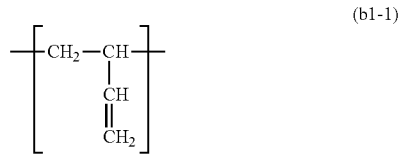

(b1-1)

In the case where the component (b1) is a polybutadiene having a 1,2-vinyl group, the content of the structural unit having a 1,2-vinyl group (the structural unit represented by the general formula (b1-1)) [the foregoing content will be hereinafter occasionally abbreviated as "vinyl group content"] relative to the total structural units derived from butadiene constituting the polybutadiene is preferably 50 mol % or more, more preferably 60 mol % or more, still more preferably 70 mol % or more, especially preferably 80 mol % or more, and most preferably 85 mol % or more from the viewpoint of compatibility with other resin, dielectric characteristics, low thermal expansion, and heat resistance. In addition, the vinyl group content may also be 100 mol % or less.

From the same viewpoint, the polybutadiene having a 1,2-vinyl group is preferably a 1,2-polybutadiene homopolymer.

A number average molecular weight of the component (b1) is preferably 400 to 2,500, more preferably 500 to 2,000, still more preferably 600 to 1,800, and especially preferably 700 to 1,500 from the viewpoint of compatibility with other resin, dielectric characteristics, low thermal expansion, and heat resistance.

((b2) Maleimide Compound Having Two or More N-Substituted Maleimide Groups)

The component (b2) may be a maleimide compound having two or more N-substituted maleimide groups, and those exemplified for the aforementioned maleimide compound (A) can be used.

The component (b2) may be used alone or may be used in combination of two or more thereof.

Of these, from the viewpoint of solubility in an organic solvent and inhibition of gelling during the reaction as well as the viewpoint of compatibility of the obtained component (B) with other resin, dielectric characteristics, low thermal expansion, and heat resistance, the component (b2) is preferably an aromatic bismaleimide compound substituted with an aliphatic hydrocarbon group, and more preferably a compound represented by the following general formula (b2-1).

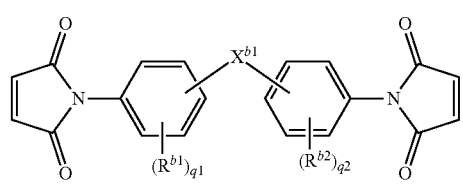

(b2-1)

In the formula, $R^{b1}$ and $R^{b2}$ are each independently an aliphatic hydrocarbon group having 1 to 5 carbon atoms; $X^{b1}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (b2-1-1); q1 and q2 are each independently an integer of 0 to 4; and (q1+q2) is an integer of 1 or more.

Examples of the aliphatic hydrocarbon group having 1 to 5 carbon atoms, which is represented by $R^{b1}$ and $R^{b2}$, include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, more preferably an alkyl group having 1 to 3 carbon atoms, and still more preferably an ethyl group or a methyl group from the viewpoint of compatibility with other resin and inhibition of gelling during the reaction.

Examples of the alkylene group having 1 to 5 carbon atoms, which is represented by $X^{b1}$, include a methylene group, a 1,2-dimethylene group, a 1,3-trimethylene group, a 1,4-tetramethylene group, and a 1,6-pentamethylene group. The alkylene group is preferably an alkylene group having 1 to 3 carbon atoms, and more preferably a methylene group.

Examples of the alkylidene group having 2 to 5 carbon atoms, which is represented by $X^{b1}$, include an ethylidene group, a propylidene group, an isopropylidene group, a butylidene group, an isobutylidene group, a pentylidene group, and an isopentylidene group.

q1 and q2 are each independently an integer of 0 to 4, and (q1+q2) is an integer of 1 or more. From the viewpoint of easiness of availability, compatibility with other resin, and inhibition of gelling during the reaction, any of them is preferably an integer of 0 to 2, more preferably 1 or 2, and still more preferably 2. In the case where q1 or q2 is an integer of 2 or more, plural $R^{b1}$'s or plural $R^{b2}$'s may be the same as or different from each other.

The divalent group represented by the general formula (b2-1-1), which is represented by $X^{b1}$, is as follows.

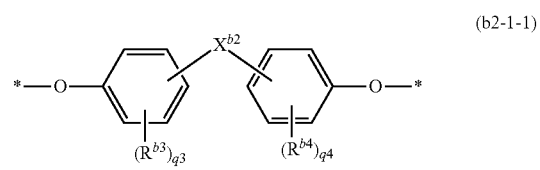

(b2-1-1)

In the formula, $R^{b3}$ and $R^{b4}$ are each independently an aliphatic hydrocarbon group having 1 to 5 carbon atoms or a halogen atom; $X^{b2}$ is an alkylene group having 1 to 5 carbon atoms, an alkylidene group having 2 to 5 carbon atoms, an ether group, a sulfide group, a sulfonyl group, a carbonyloxy group, a keto group, or a single bond; q3 and q4 are each independently an integer of 0 to 4; and * indicates a binding site.

As the aliphatic hydrocarbon group having 1 to 6 carbon atoms and a halogen atom, which are represented by $R^{b3}$ and $R^{b4}$, the same explanation as in the case of $R^{b1}$ is made.

Examples of the alkylene group having 1 to 5 carbon atoms and the alkylidene group having 2 to 5 carbon atoms, which are represented by $X^{b2}$, include the same examples as in the alkylene group having 1 to 5 carbon atoms and the alkylidene group having 2 to 5 carbon atoms, which are represented by $X^{b1}$.

q3 and q4 are each independently an integer of 0 to 4, and from the viewpoint of easiness of availability, any of them may be an integer of 0 to 2, may be 0 or 1, or may be 0. In the case where q3 or q4 is an integer of 2 or more, plural $R^{b3}$'s or plural $R^{b4}$'s may be the same as or different from each other.

Examples of the compound represented by the general formula (b2-1) include 3,3'-dimethyl-5,5'-diethyl-4,4'-diphenylmethane bismaleimide and 4-methyl-1,3-phenylene bismaleimide. Of these, from the viewpoint of solubility in an organic solvent and inhibition of gelling during the reaction as well as the viewpoint of compatibility of the obtained component (B) with other resin, dielectric characteristics, low thermal expansion, and heat resistance, 3,3'-dimethyl-5,5'-diethyl-4,4'-diphenylmethane bismaleimide is preferred.

(Reaction Conditions)

A method for allowing the component (b1) and the component (b2) to react with each other is not particularly limited, and the component (B) can be, for example, obtained by charging predetermined amounts of the component (b1), the component (b2), a reaction catalyst, and an organic solvent in a reaction vessel and performing the reaction while heating, heat insulation, stirring, and the like, as required. Although the reaction conditions in this step can be appropriately controlled according to the kinds of the raw materials to be used, etc., from the viewpoint of workability and inhibition of gelling during the reaction, a reaction temperature is preferably 70 to 120° C., more preferably 80 to 110° C., and still more preferably 85 to 105° C., and a reaction time is preferably 0.5 to 1.5 hours, more preferably 1 to 10 hours, and still more preferably 3 to 7 hours.

Although the organic solvent which is used for the reaction is not particularly limited, examples thereof include an alcohol, such as methanol, ethanol, butanol, butyl cellosolve, ethylene glycol monomethyl ether, and propylene glycol monomethyl ether; a ketone, such as acetone, methyl ethyl ketone, methyl isobutyl ketone, and cyclohexanone; an aromatic hydrocarbon, such as toluene, xylene, and mesitylene; an ester, such as methoxyethyl acetate, ethoxyethyl acetate, butoxyethyl acetate, and ethyl acetate; and a nitrogen-containing compound, such as N,N-dimethylformamide, N,N-dimethylacetamide, and N-methyl-2-pyrrolidone. These may be used alone or may be used in combination of two or more thereof. Of these, from the viewpoint of resin solubility, toluene is preferred.

In the case where the aforementioned reaction is performed in an organic solvent, though the total content (concentration of the solid components) of the component (b1) and the component (b2) in the reaction solution is not particularly limited, it is preferably 10 to 70% by mass, more preferably 15 to 60% by mass, and still more preferably 20 to 50% by mass. When the aforementioned total content is 10% by mass or more, there is a tendency that the reaction rate does not become excessively slow, and such becomes more advantageous in terms of the production cost. In addition, when the aforementioned total content is 70% by mass or less, there is a tendency that not only more favorable solubility is obtained, but also the solution viscosity is low so that stirring efficiency is well, and gelling can be more likely inhibited.

As the reaction catalyst, those exemplified for a curing accelerator (F) as mentioned later can be used. Of these, from the viewpoint of obtaining sufficient reactivity while inhibiting gelling during the reaction, an organic peroxide is preferred, and α,α'-bis(t-butylperoxy)diisopropylbenzene is more preferred.

The reaction catalyst may be used alone or may be used in combination of two or more thereof.

Although a use amount of the reaction catalyst is not particularly limited, it is preferably 0.01 to 1.2 parts by mass, more preferably 0.03 to 1.0 part by mass, and still more preferably 0.06 to 0.8 parts by mass relative to 100 parts by mass of the total amount of the component (b1) and the component (b2).

On the occasion of performing the aforementioned reaction, a blending amount of the component (b1) and the component (b2) is an amount such that a ratio $(M_m/M_v)$ of the molar number $(M_n)$ of the N-substituted maleimide group which the component (b2) has to the molar number $(M_v)$ of the side chain vinyl group which the component (b1) has is preferably 0.01 to 0.5, more preferably 0.02 to 0.4, and still more preferably 0.04 to 0.3, from the viewpoint of compatibility of the obtained component (B) with other resin and inhibition of gelling during the reaction.

According to the aforementioned reaction, at least a part of the vinyl group which the component (b1) has in the side chain reacts with the N-substituted maleimide group which the component (b2) has, whereby the component (B) is produced.

The obtained component (B) is one having a substituent (x) resulting from reaction between the vinyl group which the component (b1) has and the N-substituted maleimide group which the component (b2) has.

From the viewpoint of compatibility with other resin, dielectric characteristics, low thermal expansion, and heat resistance, the substituent (x) is preferably a group containing a structure represented by the following general formula (B-11) or (B-12) as the structure derived from the component (b2).

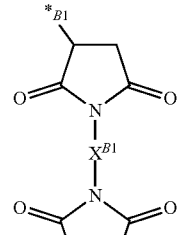

(B-11)

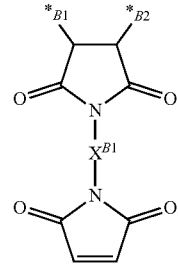

(B-12)

In the formulae, $X^{B1}$ is a divalent organic group; $*^{B1}$ is a site binding with a carbon atom derived from the vinyl group which the component (b1) has; and $*^{B2}$ is a site binding with other atom.

The explanation regarding $X^{B1}$ in the general formulae (B-11) and (B-12) is the same as in the explanation regarding $X^{a1}$ in the general formula (a1-1).

From the viewpoint of compatibility with other resin, dielectric characteristics, low thermal expansion, and heat resistance, the substituent (x) is more preferably a group containing a structure represented by the following general formula (B-21) or (B-22) as the structure derived from the component (b2).

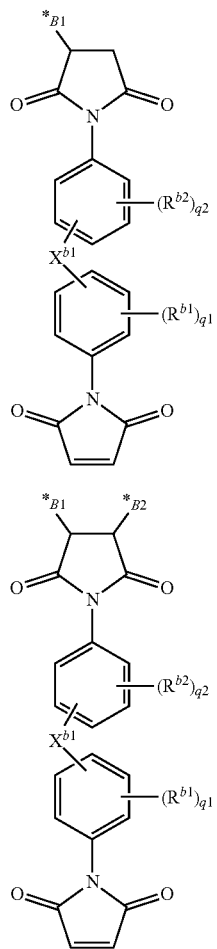

In the formulae, the explanation regarding $R^{b1}$, $R^{b2}$, $X^{b1}$, q1, and q2 is the same as in the explanation in the general formula (b2-1); and the explanation regarding $*^{B1}$ and $*^{B2}$ is the same as in the explanation in the general formulae (B-11) and (B-12).

The component (B) preferably has the substituent (x) and the vinyl group (y) in the side chain. In that case, a ratio of the number of the substituent (x) relative to the total number of the substituent (x) and the vinyl group (y) contained in one molecule [x/(x+y)] is preferably 0.01 to 0.5, more preferably 0.02 to 0.4, and still more preferably 0.04 to 0.3 from the viewpoint of compatibility with other resin, dielectric characteristics, low thermal expansion, and heat resistance.

In the following explanation, the content ratio [x/(x+y)] of the substituent (x) is occasionally referred to as "vinyl group modification ratio".

The vinyl group (y) is preferably the 1,2-vinyl group which the butadiene-derived structural unit has.

Although a number average molecular weight of the component (B) is not particularly limited, it is preferably 700 to 6,000, more preferably 800 to 5,000, still more preferably 900 to 4,500, and especially preferably 1,000 to 4,000 from the viewpoint of compatibility with other resin, dielectric characteristics, low thermal expansion, and heat resistance.

<Contents of Component (A) and Component (B) and Content Ratio Thereof>

In the resin composition of this embodiment, though the content of the component (A) is not particularly limited, it is preferably 10 to 90 parts by mass, more preferably 20 to 80 parts by mass, still more preferably 30 to 70 parts by mass, and especially preferably 35 to 60 parts by mass relative to 100 parts by mass of the total sum of the resin component in the resin composition from the viewpoint of dielectric characteristics and moldability.

In the resin composition of this embodiment, though the content of the component (B) is not particularly limited, it is preferably 1 to 50 parts by mass, more preferably 5 to 40 parts by mass, still more preferably 10 to 30 parts by mass, and especially preferably 15 to 25 parts by mass relative to 100 parts by mass of the total sum of the resin component in the resin composition from the viewpoint of compatibility with other resin, dielectric characteristics, low thermal expansion, and heat resistance.

Here, in this specification, the term "resin component" refers to the component (A) and the component (B) and further, a component (C) which is optionally used. Namely, in the case where the resin composition does not contain the component (C), the term "resin component" refers to the component (A) and the component (B), and in the case where the resin composition contains the component (C), the component (A), the component (B), and the component (C) are included in the term "resin component".

Although a content ratio [(A)/(B)] of the component (A) and the component (B) is not particularly limited, it is preferably more than 1.0, more preferably 1.5 to 5.0, still more preferably 1.8 to 4.5, yet still more preferably 2.0 to 4.0, especially preferably 2.2 to 3.5, and most preferably 2.5 to 3.0 on a mass basis from the viewpoint of compatibility with other resin, dielectric characteristics, low thermal expansion, and heat resistance. When the content ratio [(A)/(B)] is more than 1.0, there is a tendency that excellent dielectric characteristics in a high frequency band of 10 GHz or higher are obtained, whereas when it is 5.0 or less, there is a tendency that the heat resistance, the moldability, and the processability are excellent.

<Other Components>

The resin composition of this embodiment may be one further including other components. Examples of the other components include at least one selected from the group consisting of a thermoplastic elastomer (C) other than the component (B) [hereinafter occasionally abbreviated as "other thermoplastic elastomer (C)" or "component (C)"], an inorganic filler (D) [hereinafter occasionally abbreviated as "component (D)"], a flame retardant (E) [hereinafter occasionally abbreviated as "component (E)"], and a curing accelerator (F) [hereinafter occasionally abbreviated as "component (F)"]. By incorporating such a component, various characteristics on the occasion of fabricating into a laminate can be more improved.

However, the resin composition of this embodiment may not contain at least one selected from the group consisting of the component (C), the component (D), the component (E), and the component (F) according to the desired performance.

These components are hereunder described in detail.

(Other Thermoplastic Elastomer (C))

Examples of the other thermoplastic elastomer (C) include polyphenylene ether and a styrene-based thermoplastic elastomer. Of these, a styrene-based thermoplastic elastomer is preferred because there is a tendency that the resulting resin composition becomes favorable in dielectric characteristics, moldability, adhesiveness to a conductor, solder heat resistance, glass transition temperature, thermal expansion coefficient, and flame retardancy, and a balance among them becomes good.

The component (C) is not particularly restricted so long as it is a thermoplastic elastomer having a styrene-based compound-derived structural unit, and it may be one having a styrene-derived structural unit represented by the following general formula (c-1).

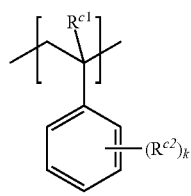

(c-1)

In the formula, $R^{c1}$ is a hydrogen atom or an alkyl group having 1 to 5 carbon atoms; $R^{c2}$ is an alkyl group having 1 to 5 carbon atoms; and k is an integer of 0 to 5.

Examples of the alkyl group having 1 to 5 carbon atoms, which is represented by $R^{c1}$ and $R^{c2}$, include a methyl group, an ethyl group, and a n-propyl group, and the foregoing alkyl group may be an alkyl group having 1 to 3 carbon atoms, or may be methyl group.

k may be an integer of 0 to 2, may be 0 or 1, or may be 0.

Examples of the structural unit other than the styrene-based compound-derived structural unit, which the component (C) has, include a butadiene-derived structural unit, an isoprene-derived structural unit, a maleic acid-derived structural unit, and a maleic anhydride-derived structural unit.

The component (C) may be used alone or may be used in combination of two or more thereof.

The aforementioned butadiene-derived structural unit and the aforementioned isoprene-derived structural unit may be hydrogenated. In the case of being hydrogenated, the butadiene-derived structural unit becomes a structural unit in which an ethylene unit and a butylene unit are mixed, and the isoprene-derived structural unit becomes a structural unit in which an ethylene unit and a propylene unit are mixed.

From the viewpoint of dielectric characteristics, adhesiveness to a conductor, heat resistance, glass transition temperature, and thermal expansion coefficient, the component (C) is preferably at least one selected from the group consisting of a hydrogenation product of a styrene-butadiene-styrene block copolymer (SEBS or SBBS), a hydrogenation product of a styrene-isoprene-styrene block copolymer (SEPS), and a styrene-maleic anhydride copolymer (SMA); more preferably at least one selected from the group consisting of a hydrogenation product of a styrene-butadiene-styrene block copolymer (SEBS) and a hydrogenation product of a styrene-isoprene-styrene block copolymer (SEPS); and still more preferably a hydrogenation product of a styrene-butadiene-styrene block copolymer (SEBS).

In the aforementioned SEBS, the content of the styrene-derived structural unit (hereinafter occasionally abbreviated as "styrene content") is preferably 5 to 80% by mass, more preferably 10 to 75% by mass, still more preferably 15 to 70% by mass, and especially preferably 20 to 50% by mass from the viewpoint of dielectric characteristics, adhesiveness to a conductor, heat resistance, glass transition temperature, and thermal expansion coefficient. Although a melt flow rate (MFR) of the SEBS is not particularly limited, it may be 0.1 to 20 g/10 min, or may be 0.5 to 15 g/10 min under measurement conditions of 230° C. and a load of 2.16 kgf (21.2 N).

Examples of a commercially available product of the SEBS include TUFTEC (registered trademark) H Series and M Series, manufactured by Asahi Chemical Industry Co., Ltd.; SEPTON (registered trademark) Series, manufactured by Kuraray Co., Ltd.; and KRATON (registered trademark) G Polymer Series, manufactured by Kraton Polymers Japan Ltd.

Although a weight average molecular weight (Mw) of the component (C) is not particularly limited, it is preferably 12,000 to 1,000,000, more preferably 30,000 to 500,000, still more preferably 50,000 to 120,000, and especially preferably 70,000 to 100,000. The weight average molecular weight (Mw) is measured by gel permeation chromatography (GPC) as expressed in terms of polystyrene.

In the case where the resin composition of this embodiment contains the component (C), the content of the component (C) is preferably 5 to 60 parts by mass, more preferably 10 to 55 parts by mass, still more preferably 15 to 50 parts by mass, especially preferably 20 to 45 parts by mass, and most preferably 25 to 40 parts by mass relative to 100 parts by mass of the total sum of the components (A) to (C) from the viewpoint of dielectric characteristics, adhesiveness to a conductor, heat resistance, glass transition temperature, and thermal expansion coefficient. When the aforementioned content of the component (C) is 5 parts by mass or more, there is a tendency that the dielectric characteristics and the hygroscopicity resistance become more favorable, whereas when it is 60 parts by mass or less, there is a tendency that the heat resistance, the moldability, the processability, and the flame retardancy become more favorable.

(Inorganic Filler (D))

By incorporating the inorganic filler (D) into the resin composition of this embodiment, there is a tendency that the thermal expansion coefficient, the elastic modulus, the heat resistance, and the flame retardancy can be improved.

Although the component (D) is not particularly limited, examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay (e.g., calcined clay), talc, aluminum borate, and silicon carbide. These may be used alone or may be used in combination of two or more thereof. Of these, from the viewpoint of thermal expansion coefficient, elastic modulus, heat resistance, and flame retardancy silica, alumina, mica, and talc are preferred, silica and alumina are more preferred, and silica is still more preferred. Examples of the silica include a precipitated silica which is produced by a wet method and has a high water content; and a dry silica which is produced by a dry method and contains little bound water. Examples of the dry silica include crushed silica, fumed silica, and molten silica (molten spherical silica) depending on the production method.

Although the shape and the particle diameter of the inorganic filler (D) are not particularly limited, for example, the particle diameter is preferably 0.01 to 20 μm, more preferably 0.1 to 10 μm, still more preferably 0.2 to 1 μm, and especially preferably 0.3 to 0.8 μm. Here, the particle diameter refers to an average particle diameter and is a particle diameter of a point corresponding to a volume of 50% in a cumulative frequency distribution curve that is determined by particle diameters with the whole volume of particles taken as 100%. The particle diameter of the inorganic filler (D) can be measured by a particle size distribution measurement apparatus using a laser diffraction scattering method or the like.

In the case where the resin composition of this embodiment contains the component (D), though the content of the component (D) in the resin composition is not particularly limited, it is preferably 5 to 70% by mass, more preferably 15 to 65% by mass, still more preferably 20 to 60% by mass, especially preferably 30 to 55% by mass, and most preferably 40 to 50% by mass from the viewpoint of thermal expansion coefficient, elastic modulus, heat resistance, and flame retardancy, In the case of using the component (D), for the purpose of improving the dispersibility of the component (D) and adhesion of the component (D) to an organic component in the resin composition, a coupling agent may be jointly used, as required. The coupling agent is not particularly limited, and for example, a silane coupling agent or a titanate coupling agent can be appropriately selected and used. The coupling agent may be used alone or may be used in combination of two or more thereof. In addition, a use amount of the coupling agent is not particularly limited, and for example, it may be 0.1 to 5 parts by mass, or may be 0.5 to 3 parts by mass relative to 100 parts by mass of the component (D). When the use amount of the component (D) falls within this range, there is a tendency that lowering of various characteristics becomes small, and the advantages owing to the use of the component (D) can be effectively exhibited.

In the case of using the coupling agent, the treatment method may be a so-called integral blend treatment method in which the component (D) is blended in the resin composition, and then, the coupling agent is added, but is preferably a method in which an inorganic filler previously surface-treated with a coupling agent by a dry or wet method is used. By adopting this method, the advantages of the component (D) can be more effectively exhibited.

In this embodiment, in the case of using the component (D), for the purpose of improving the dispersibility of the component (D) into the resin composition, the component (D) can be used in the form of a slurry in which the component (D) is previously dispersed in an organic solvent, as required. Although the organic solvent which is used on the occasion of forming the component (D) into a slurry is not particularly limited, for example, the organic solvents exemplified in the production step of the component (A1) as mentioned above can be applied. Of these, from the viewpoint of dispersibility, methyl ethyl ketone, methyl isobutyl ketone, and cyclohexanone are preferred. In addition, though a concentration of the solid components (non-volatile components) of the slurry is not particularly limited, for example, it is 50 to 80% by mass, or may be 60 to 80% by mass from the viewpoint of settleability and dispersibility of the inorganic filler (D).

(Flame Retardant (E))

By incorporating the flame retardant (E) into the resin composition of this embodiment, there is a tendency that the flame retardancy of the resin composition can be improved.

Examples of the component (E) include a phosphorus-based flame retardant, a metal hydrate, and a halogen-based flame retardant, and the component (E) may be a phosphorus-based flame retardant or a metal hydrate from the viewpoint of environmental issue. The flame retardant (E) may be used alone or may be used in combination of two or more thereof. A flame retardant auxiliary may be further incorporated, as required.

—Phosphorus-Based Flame Retardant—

The phosphorus-based flame retardant is not particularly limited so long as it is one containing a phosphorus atom among usual flame retardants, and it may be an inorganic phosphorus-based flame retardant or may be an organic phosphorus-based flame retardant. The phosphorus-based flame retardant is preferably one not containing a halogen atom from the viewpoint of environmental issue. The phosphorus-based flame retardant may be an organic phosphorus-based flame retardant from the viewpoint of dielectric characteristics, adhesiveness to a conductor, heat resistance, glass transition temperature, thermal expansion coefficient, and flame retardancy.

Examples of the inorganic phosphorus-based flame retardant include red phosphorus; an ammonium phosphate, such as monoammonium phosphate, diammonium phosphate, triammonium phosphate, and ammonium polyphosphate; an inorganic nitrogen-containing phosphorus compound, such as phosphoric amide; phosphoric acid; and phosphine oxide.

Examples of the organic phosphorus-based flame retardant include an aromatic phosphoric acid ester, a monosubstituted phosphonic acid diester, a disubstituted phosphinic acid ester, a disubstituted phosphinic acid metal salt, an organic nitrogen-containing phosphorus compound, and a cyclic organic phosphorus compound. Of these, an aromatic phosphoric acid ester compound and a disubstituted phosphinic acid metal salt are preferred. Here, the metal salt may be any of a lithium salt, a sodium salt, a potassium salt, a calcium salt, a magnesium salt, an aluminum salt, a titanium salt, and a zinc salt, or may be an ammonium salt. In addition, among the organic phosphorus-based flame retardants, an aromatic phosphoric acid ester is preferred.

Examples of the aromatic phosphoric acid ester include triphenyl phosphate, tricresyl phosphate, trixylenyl phosphate, cresyl diphenyl phosphate, cresyl-2,6-xylenyl phosphate, resorcinol bis(diphenyl phosphate), 1,3-phenylenebis(di-2,6-xylenyl phosphate), bisphenol A-bis(diphenyl phosphate), and 1,3-phenylene bis(diphenyl phosphate).

Examples of the monosubstituted phosphonic acid diester include divinyl phenylphosphonate, diallyl phenylphosphonate, and bis(1-butenyl) phenylphosphonate.

Examples of the disubstituted phosphinic acid ester include phenyl diphenylphosphinate and methyl diphenylphosphinate.

Examples of the disubstituted phosphinic acid metal salt include a dialkylphosphinic acid metal salt, a diallylphosphinic acid metal salt, a divinylphosphinic acid metal salt, and a diarylphosphinic acid metal salt. Such a metal salt may be any of a lithium salt, a sodium salt, a potassium salt, a calcium salt, a magnesium salt, an aluminum salt, a titanium salt, and a zinc salt, or may be an aluminum salt.

Examples of the organic nitrogen-containing phosphorus compound include a phosphazene compound, such as bis(2-allylphenoxy)phosphazene and dicresylphosphazene; melamine phosphate; melamine pyrophosphate; melamine polyphosphate; and melam polyphosphate.

Examples of the cyclic organic phosphorus compound include 9,10-dihydro-9-oxa-10-phosphaphenanthrene-10-oxide and 10-(2,5-dihydroxyphenyl)-9,10-dihydro-9-oxa-10-phosphaphenanthrene-10-oxide.

Of these, an aromatic phosphoric acid ester and a disubstituted phosphinic acid metal salt are preferred, and 1,3- phenylenebis(di-2,6-xylenyl phosphate) and a dialkylphosphinic acid aluminum salt are preferred.

—Metal Hydrate—

Examples of the metal hydrate include an aluminum hydroxide hydrate and a magnesium hydroxide hydrate. These may be used alone or may be used in combination of two or more thereof. Although the metal hydroxide may also be corresponding to the inorganic filler, in the case of a material capable of imparting flame retardancy, it is classified into the flame retardant.

—Halogen-Based Flame Retardant—

Examples of the halogen-based flame retardant include a chlorine-based flame retardant and a bromine-based flame retardant. Examples of the chlorine-based flame retardant include a chlorinated paraffin.

In the case where the resin composition of this embodiment contains the component (E), when a phosphorus-based flame retardant is used as the component (E), though the content of the phosphorus-based flame retardant in the resin composition is not particularly limited, for example, it is preferably 0.2 to 20 parts by mass, more preferably 1 to 15 parts by mass, and still more preferably 5 to 12 parts by mass as expressed in terms of a phosphorus atom relative to 100 parts by mass of the total sum of the resin component in the resin composition. When the content of the component (E) as expressed in terms of a phosphorus atom is 0.2 parts by mass or more, there is a tendency that more favorable flame retardancy is obtained, whereas when it is 20 parts by mass or less, there is a tendency that more favorable moldability and high adhesiveness to a conductor, excellent heat resistance, and high glass transition temperature are obtained.

(Curing Accelerator (F))

By incorporating the curing accelerator (F) into the resin composition of this embodiment, there is a tendency that the curability of the resin composition is improved, and dielectric characteristics, heat resistance, adhesiveness to a conductor, elastic modulus, and glass transition temperature can be improved.

Examples of the component (F) include an acidic catalyst, such as p-toluenesulfonic acid; an amine compound, such as triethylamine, pyridine, and tributylamine; an imidazole compound, such as methylimidazole, phenylimidazole, and an isocyanate mask imidazole (for example, an addition reaction product between a hexamethylenediisocyanate resin and 2-ethyl-4-methylimidazole); a tertiary amine compound; a quaternary ammonium compound; a phosphorus-based compound, such as triphenyl phosphine; an organic peroxide, such as dicumyl peroxide, 2,6-dimethyl-2,5-bis(t-butylperoxy)hexine-3, 2,5-dimethyl-2,5-(t-butylperoxy) hexane, t-butylperoxyisopropyl monocarbonate, and α,α'-bis(t-butylperoxy) diisopropylbenzene; and a carboxylic acid salt of manganese, cobalt, zinc, etc. These may be used alone or may be used in combination of two or more thereof. Of these, from the viewpoint of heat resistance, glass transition temperature, and storage stability, the component (F) may be an imidazole compound, an organic peroxide, or a carboxylic acid salt; and from the viewpoint of heat resistance, glass transition temperature, elastic modulus, and thermal expansion coefficient, an imidazole compound may be used in combination with an organic peroxide or a carboxylic acid salt. In addition, among the organic peroxides, α,α'-bis(t-butylperoxy) diisopropylbenzene may be selected, and among the carboxylic acid salts, manganese naphthenate may be selected.

In the case where the resin composition of this embodiment contains the component (F), though the content of the component (F) is not particularly limited, for example, it is preferably 0.01 to 10 parts by mass, more preferably 0.05 to 8 parts by mass, still more preferably 0.1 to 6 parts by mass, and especially preferably 0.5 to 5 parts by mass relative to 100 parts by mass of the total sum of the resin component in the resin composition. When the content of the component (F) falls within the aforementioned range, there is a tendency that more favorable heat resistance and storage stability are obtained.

In the resin composition of this embodiment, a resin material, such as other thermoplastic resin and elastomer than the aforementioned respective resins, as well as an antioxidant, a thermal stabilizer, an antistatic agent, a UV absorbent, a pigment, a colorant, a lubricant, and the like can be appropriately selected and incorporated, as required. These may be used alone or may be used in combination of two or more thereof. In addition, a use amount thereof is not particularly limited, and such a material may be used within a range where the effects of the present invention are not impaired.

(Organic Solvent)

From the viewpoint of facilitating the handling through dilution as well as the viewpoint of facilitating the production of a prepreg as mentioned later, the resin composition of this embodiment may contain an organic solvent. In general, the resin composition having an organic solvent contained therein is occasionally referred to as "resin varnish" or "varnish".

Although the organic solvent is not particularly limited, examples thereof include an alcohol-based solvent, such as ethanol, propanol, butanol, methyl cellosolve, butyl cellosolve, and propylene glycol monomethyl ether; a ketone-based solvent, such as acetone, methyl ethyl ketone, methyl isobutyl ketone, and cyclohexanone; an ether-based solvent, such as tetrahydrofuran; an aromatic solvent, such as toluene, xylene, and mesitylene: a nitrogen atom-containing solvent, such as dimethylformamide, dimethylacetamide, and N-methylpyrrolidone; a sulfur atom-containing solvent, such as dimethyl sulfoxide; and an ester-based solvent, such as γ-butyrolactone.

Of these, from the viewpoint of solubility, an alcohol-based solvent, a ketone-based solvent, and a nitrogen atom-containing solvent are preferred; a ketone-based solvent is more preferred; acetone, methyl ethyl ketone, methyl isobutyl ketone, and cyclohexanone are still more preferred; and methyl ethyl ketone is especially preferred.

The organic solvent may be used alone or may be used in combination of two or more thereof.

In the case where the resin composition of this embodiment contains an organic solvent, the concentration of the solid components thereof is, for example, 30 to 90% by mass, may be 35 to 80% by mass, or may be 40 to 60% by mass. By using a resin composition in which the concentration of the solid components falls within the aforementioned range, there is a tendency that the handleability becomes easy, the impregnation properties into a substrate and the appearance of a produced prepreg are favorable, the control of the concentration of the solid components of the resin in a prepreg as mentioned later becomes easy, and the production of a prepreg having a desired thickness becomes easy.

The resin composition of this embodiment can be produced by mixing the component (A) and the component (B) and if desired, optional components to be jointly used by a known method. On that occasion, the respective components may be dissolved or dispersed while stirring. Conditions, such as order of mixing, temperature, time, and the like are not particularly limited and can be appropriately set according to the types of the raw materials and so on.

The resin composition of this embodiment is favorable in compatibility, and there is a tendency that even if allowing to stand for one day, no deposit is produced. In addition, in an embodiment with more favorable compatibility, there is a tendency that even if allowing to stand for one week, no deposit is produced (however, phase separation occasionally occurs); and in an embodiment with still more favorable compatibility, there is a tendency that even if allowing to stand for one week, even phase separation does not occur.

A dielectric constant (Dk) at 10 GHz of a cured product of the resin composition of this embodiment (a laminate not including a fiber substrate, such as a glass cloth, and a cured product of a resin film) is preferably 3.0 or less, more preferably 2.9 or less, and still more preferably 2.8 or less. The dielectric constant (Dk) is preferably smaller, and a lower limit value thereof is not particularly restricted; however, taking into consideration a balance with other physical properties, for example, it may be 2.4 or more, or may be 2.5 or more.

A dielectric dissipation factor (Dk) at 10 GHz of a cured product of the resin composition of this embodiment (a laminate not including a fiber substrate, such as a glass cloth, and a cured product of a resin film) is preferably 0.0050 or less, more preferably 0.0040 or less, still more preferably 0.0030 or less, especially preferably 0.0025 or less, and most preferably 0.0020 or less. The dielectric dissipation factor (Df) is preferably smaller, and a lower limit value thereof is not particularly restricted; however, taking into consideration a balance with other physical properties, for example, it may be 0.0010 or more, or may be 0.0015 or more.

It is to be noted that the dielectric constant (Dk) and the dielectric dissipation factor (DO are values according to a cavity resonator perturbation method, and in more detail, are values measured by a method described in the section of Examples. In addition, in this specification, when the dielectric constant is simply referred to herein, it means a relative permittivity.

[Production Method of Maleimide Resin Composition]

The production method of the maleimide resin composition of this embodiment is a method for producing the maleimide resin composition of this embodiment including the following steps 1 and 2:

Step 1: a step of allowing (b1) a conjugated diene polymer having a vinyl group in the side chain and (b2) a maleimide compound having two or more N-substituted maleimide groups to react with each other, to obtain (B) a modified conjugated diene polymer; and Step 2: a step of mixing (A) at least one selected from the group consisting of a maleimide compound having two or more N-substituted maleimide groups and a derivative thereof with the modified conjugated diene polymer (B).

Suitable conditions of the reaction in the step 1 are those described in the explanation regarding the component (B).

The mixing in the step 2 may be performed using a known stirrer or the like, and for example, it is preferred to put the component (A) and the component (B) into the aforementioned organic solvent and stirring for mixing the contents at room temperature or under heating. A heating temperature on the occasion of mixing is, for example, 30 to 100° C., and preferably 40 to 90° C.

A concentration of the component (A) and the component (B) in the mixed solution at the time of mixing is the same as the suitable range of the concentration of the solid components of the resin composition in the case where the resin composition of this embodiment contains the organic solvent.

[Prepreg]

The prepreg of this embodiment is a prepreg formed by including the maleimide resin composition of this embodiment.

The prepreg of this embodiment is, for example, one including the resin composition of this embodiment and a sheet-shaped fiber-reinforced substrate. The prepreg is formed by using the resin composition of this embodiment and the sheet-shaped fiber-reinforced substrate, and for example, it can be obtained by impregnating or coating the sheet-shaped fiber-reinforced substrate with the resin composition of this embodiment, followed by drying. More specifically, for example, the prepreg of this embodiment can be produced by heating for drying in a drying furnace typically at a temperature of 80 to 200° C. for 1 to 30 minutes to semi-cure (convert into B-stage) the resin composition. A use amount of the resin composition can be determined such that the concentration of the solid components derived from the resin composition in the prepreg after drying is 30 to 90% by mass. By allowing the concentration of the solid components to fall within the aforementioned range, there is a tendency that on the occasion of forming into a laminate, more favorable moldability is obtained.

As the sheet-shaped fiber-reinforced substrate of the prepreg, a known substrate used in various laminates for electrical insulating materials is used. Examples of the material for the sheet-shaped fiber-reinforced substrate include an inorganic fiber, such as E-glass, D-glass, S-glass, and Q-glass; an organic fiber, such as a polyimide, a polyester, and tetrafluoroethylene; and a mixture thereof. Such a sheet-shaped fiber-reinforced substrate has a shape of, for example, woven fabric, nonwoven fabric, roving, chopped strand mat, surfacing mat, or the like.

Although a thickness of the sheet-shaped fiber-reinforced substrate is not particularly limited, for example, a substrate of 0.02 to 0.5 mm can be used.

From the viewpoint of impregnation properties with the resin composition as well as heat resistance, hygroscopicity resistance, and processability when formed into a laminate, a substrate surface-treated with a coupling agent or the like and a substrate mechanically treated for fiber opening can be used as the sheet-shaped fiber-reinforced substrate.

As a method for impregnating or coating the sheet-shaped fiber-reinforced substrate with the resin composition, the following hot melt method or solvent method can be adopted.

The hot melt method is (1) a method in which a coating paper with good releasability from the resin composition is once coated with the resin composition and then laminated on the sheet-shaped fiber-reinforced substrate, or (2) a method in which the sheet-shaped fiber-reinforced substrate is directly coated with the resin composition by a die coater, without incorporating an organic solvent into the resin composition.

On the other hand, the solvent method is a method in which an organic solvent is incorporated in the resin composition, and the sheet-shaped fiber-reinforced substrate is immersed in the resulting resin composition to impregnate the sheet-shaped fiber-reinforced substrate with the resin composition, followed by drying.

[Resin Film]

The resin film of this embodiment is a resin film formed by including the resin composition of this embodiment.

The resin film of this embodiment can be, for example, produced by coating the resin composition containing an organic solvent, namely the resin varnish on a support, followed by heating for drying.

Examples of the support include a film of a polyolefin, such as polyethylene, polypropylene, and polyvinyl chloride; a film of a polyester, such as polyethylene terephthalate (hereinafter also referred to as "PET") and polyethylene naphthalate; and various plastic films, such as a polycarbonate film and a polyimide film. In addition, as the support, a metal foil, such as a copper foil and an aluminum foil, a release paper, and the like may be used. The support may be one having been subjected to a surface treatment, such as a matting treatment and a corona discharge treatment. In addition, the support may be one having been subjected to a release treatment with a silicone resin-based release agent, an alkyd resin-based release agent, a fluorine resin-based release agent, etc.

Although a thickness of the support is not particularly limited, it is preferably 10 to 150 µm, and more preferably 25 to 50 µm.

The method for coating the resin varnish on the support is not particularly limited, and a coating apparatus which is known by those skilled in the art, such as a comma coater, a bar coater, a kiss coater, a roll coater, a gravure coater, and a die coater, can be used. Such a coating apparatus may be appropriately selected according to the film thickness.

Although a drying temperature and a drying time may be appropriately determined according to the use amount of the organic solvent, the boiling point of the used organic solvent, and the like, for example, in the case of a resin varnish containing about 40 to 60% by mass of the organic solvent, the resin film can be suitably formed by drying at 50 to 150° C. for about 3 to 10 minutes.

[Laminate]

The laminate of this embodiment is a laminate formed by including the prepreg of this embodiment and a metal foil.

The laminate of this embodiment can be, for example, obtained by placing a metal foil on one face or both faces of one prepreg of this embodiment or placing a metal foil on one face or both faces of a stack of two or more prepregs of this embodiment, and then molding the resultant with heat and pressure. The laminate including a metal foil is occasionally referred to as "metal-clad laminate".

Although the metal for the metal foil is not particularly limited so long as it is one used as an electrical insulating material, from the viewpoint of conductivity, it may be copper, gold, silver, nickel, platinum, molybdenum, ruthenium, aluminum, tungsten, iron, titanium, chromium, or an alloy containing one or more of these metal elements. Copper and aluminum are preferred, and copper is more preferred.

Although the conditions for molding with heat and pressure are not particularly limited, for example, the molding can be, for example, carried out in a range where the temperature is 100 to 300° C., the pressure is 0.2 to 10 MPa, and the time is 0.1 to 5 hours. In addition, for the molding with heat and pressure, a method in which a vacuum state can be kept for 0.5 to 5 hours by using a vacuum pump or the like can be adopted.

[Multilayer Printed Wiring Board]

The multilayer printed wiring board of this embodiment is one formed by including at least one selected from the group consisting of the prepreg of this embodiment, the resin film of this embodiment, and the laminate of this embodiment. The multilayer printed wiring board of this embodiment can be produced using at least one selected from the group consisting of the prepreg of this embodiment, the resin film of this embodiment, and the laminate of this embodiment, through circuit formation processing by drilling, metal plating, metal foil etching, or the like and multilayer adhesion processing, by known methods.

[Semiconductor Package]

The semiconductor package of this embodiment is one formed by including a semiconductor having the printed wiring board of this embodiment mounted thereon. The semiconductor package of this embodiment can be produced by mounting a semiconductor chip, a memory, and the like on predetermined positions on the printed wiring board of this embodiment.

The resin composition, the prepreg, the laminate, the resin film, the multilayer printed wiring board, and the semiconductor package according to the embodiments of the present invention can be used for electronic devices handling high-frequency signals of 10 GHz or higher. In particular, the multilayer printed wiring board is useful as a multilayer printed wiring board for millimeter wave radar.

Suitable embodiments of the present invention are described hereinabove, but these are exemplification for explaining the present invention, and it is not intended to limit the scope of the present invention to these embodiments. The present invention can be implemented in various aspects different from the embodiments without departing from the gist of the present invention.

EXAMPLES

The present invention is hereunder specifically described by reference to Examples, but it should be construed that the present invention is not limited to the following Examples.

It is to be noted that, in each of the Examples, the number average molecular weight was measured by the following procedure.

(Measurement Method of Number Average Molecular Weight)

The number average molecular weight was calculated based on a calibration curve obtained using standard polystyrene by gel permeation chromatography (GPC). The calibration curve was obtained using standard polystyrene: TSK standard POLYSTYRENE (Type; A-2500, A-5000, F-1, F-2, F-4, F-10, F-20, F-40) (manufactured by Tosoh Corporation, trade names) with a cubic approximation. The measurement conditions of GPC are shown below.

Apparatus: High-performance GPC apparatus HLC-8320 GPC

Detector: Ultraviolet absorption detector UV-8320 [manufactured by Tosoh Corporation]

Column: Guard column; TSK Guard column Super HHR-L+column; TSKgel Super HZM-N+TSKgel Super HZM-M+TSKgel Super H-RC (all manufactured by Tosoh Corporation, tradenames)

Column size: 4.6×20 mm (guard column), 4.6×160 mm (column), 6.0×150 mm (reference column)

Eluent: Tetrahydrofuran
  Sample concentration: 10 mg/5 mL
  Injection: 25 µL
  Flow rate: 1.00 mL/min
  Measurement temperature: 40° C.

(Measurement of Vinyl Group Modification Ratio)

The vinyl group modification ratio of the conjugated diene polymer was obtained by measuring the GPC regarding a solution containing the component (b1) and the component (b2) before commencement of the reaction and a solution containing the modified conjugated diene polymer obtained after the reaction and determining a reduction ratio of a peak area derived from the component (b2) before and after the reaction, namely [{(peak area derived from the component (b2) before the reaction)–(peak area derived from the component (b2) after the reaction)×100}/(peak area derived from the component (b2) before the reaction)].
[Production of Modified Conjugated Diene Polymer]

Production Examples 1 to 5

Into a glass-made reaction vessel of a 2 L volume which was equipped with a thermometer, a reflux condenser, and a stirrer and was able to be heated and cooled, the component (b1) and the component (b2) in amounts shown in Table 1 and a reaction catalyst and an organic solvent were put and allowed to react in a nitrogen atmosphere while stirring at 90 to 100° C. for 5 hours. There were obtained solutions of modified conjugated diene polymers B-1 to B-5 (concentration of solid components: 35% by mass). The vinyl group modification ratio and number average molecular weight of each of the obtained modified conjugated diene polymers are shown in Table 1.

Teijin Limited, a trade name: G2-38) and then heated for drying at 170° C. for 5 minutes, to fabricate a resin film in the B-stage state. This resin film was exfoliated from the PET film and then pulverized to form a resin powder. Subsequently, the resin powder was put on a TEFLON (registered trademark) sheet having been punched out in a size of 1 mm in thickness×50 mm in length×35 mm in width; a low profile copper foil having a thickness of 18 μm (manufactured by Furukawa Electric Co., Ltd., a trade name: BF-ANP18) was placed on the upper and lower faces thereof such that the M surface was in contact with the resin powder as put thereon; and molding was performed with heat and pressure under conditions of a temperature of 230° C., a pressure of 2.0 MPa, and a time of 120 minutes to cure the resin composition, thereby fabricating a double-side copper foil-attached resin plate (thickness of resin plate: 1 mm).
[Evaluation and Measurement Methods]

Using the resin compositions and double-side copper foil-attached resin plates obtained in the aforementioned Examples and Comparative Examples, the respective measurements and evaluations were performed according to the following methods. The results are shown in Table 2.

TABLE 1

| | | | Production Example 1 | Production Example 2 | Production Example 3 | Production Example 4 | Production Example 5 |
|---|---|---|---|---|---|---|---|
| Number of modified conjugated diene polymer (B) | | | B-1 | B-2 | B-3 | B-4 | B-5 |
| Component (b1) | Polybutadiene b1-1 | parts by mass | 33.5 | 34.2 | 32.1 | 33.1 | |
| | Polybutadiene b1-2 | parts by mass | | | | | 34.5 |
| Component (b2) | Bismaleimide compound b2-1 | parts by mass | 1.47 | 0.77 | 2.87 | | 0.47 |
| | Bismaleimide compound b2-2 | parts by mass | | | | 1.87 | |
| Physical properties | Vinyl group modification ratio | % | 40 | 35 | 40 | 100 | 40 |
| | Number average molecular weight | — | 3,500 | 3,300 | 3,600 | 3,200 | 5,100 |

Details of the respective components described in Table 1 are as follows.
[Component (b1)]
  Polybutadiene b1-1: 1,2-Polybutadiene homopolymer, number average molecular weight=1,200, vinyl group content=85% or more
  Polybutadiene b1-2: 1,2-Polybutadiene homopolymer, number average molecular weight=3,200, vinyl group content=92% or more
[Component (b2)]
  Bismaleimide compound b2-1: 3,3'-Dimethyl-5,5'-diethyl-4,4'-diphenylmethane bismaleimide
  Bismaleimide compound b2-2: 2,2-Bis[4-(4-maleimidophenoxy)phenyl]propane
[Preparation of Maleimide Resin Composition]

Examples 1 to 5 and Comparative Examples 1 to 3

The respective components described in Table 2 were stirred and mixed at room temperature or while heating at 60 to 80° C. together with a predetermined amount of a curing accelerator in blending amounts (unit: parts by mass) described in Table 2, to prepare resin compositions having a concentration of the solid components (non-volatile components) of about 50% by mass.

The resin composition obtained in each of the Examples was coated on a 38 μm-thick PET film (manufactured by (1. Evaluation of Compatibility of Resin Composition)

The resin composition obtained in each of the Examples was visually observed and evaluated for compatibility (presence or absence of macroscopic phase separation and deposit) according to the following criteria.

A: Even when allowing to stand for one week or more, neither macroscopic phase separation nor deposit was produced.

B: Even when allowing to stand for one day, no change was found; but when allowing to stand for 3 days or more, though no deposit was produced, macroscopic phase separation was slightly produced.

C: When allowing to stand for one day, though no deposit was produced, macroscopic phase separation was produced.

D: After allowing to stand for one day, a deposit was confirmed.

(2. Evaluation of Dielectric Characteristics (Dielectric Constant and Dielectric Dissipation Factor) of Resin Plate)

From an evaluation substrate prepared by immersing the double-side copper foil-attached resin plate obtained in each of the Examples in a 10% by mass solution of ammonium persulfate (manufactured by Mitsubishi Gas Chemical Company, Inc.) that is a copper etching solution to remove the copper foil, an evaluation substrate of 2 mm×50 mm was fabricated.

The evaluation substrate was measured for dielectric constant (Dk) and dielectric dissipation factor (Df) in a 10 GHZ band in conformity with a cavity resonator perturbation method.
(3. Measurement Methods of Coefficient of Thermal Expansion and Glass Transition Temperature)

Using a 5-mm square test piece prepared by etching the copper foil on the both faces of the double-side copper foil-attached resin plate, the thermal expansion coefficient (plate thickness direction, temperature range: 30 to 120° C.) and the glass transition temperature (Tg) were measured with a thermomechanical measuring apparatus (TMA) [manufactured by TA Instruments Japan Inc., Q400 (model number)] in conformity with the IPC (The Institute for Interconnecting and Packaging Electronic Circuits) Standards.

[Component (E)]

Aluminum trisdiethylphosphinate

As is clear from the results shown in Table 2, in the resin compositions obtained in Examples 1 to 5 of this embodiment, the compatibility is favorable, and the cured products fabricated using these are excellent in heat resistance and low thermal expansion and excellent in dielectric characteristics in a high frequency band of 10 GHz.

On the other hand, in Comparative Examples 1 and 2, the compatibility is low, and the dielectric characteristics in a high frequency band of 10 GHz are insufficient. In addition, in Comparative Example 3, the dielectric characteristics in a high frequency of 10 GHz are insufficient.

TABLE 2

| | | Example | | | | | Comparative Example | | |
|---|---|---|---|---|---|---|---|---|---|
| | | 1 | 2 | 3 | 4 | 5 | 1 | 2 | 3 |
| Component (A) | Bismaleimide compound A-1 | 24.7 | 24.7 | 24.7 | 24.7 | 24.7 | 24.7 | 24.7 | 24.7 |
| | Bismaleimide compound A-2 | | | | | | | 0.8 | |
| Component (B) | Modified conjugated diene polymer B-1 | 9.9 | | | | | | | |
| | Modified conjugated diene polymer B-2 | | 9.9 | | | | | | |
| | Modified conjugated diene polymer B-3 | | | 9.9 | | | | | |
| | Modified conjugated diene polymer B-4 | | | | 9.9 | | | | |
| | Modified conjugated diene polymer B-5 | | | | | 9.9 | | | |
| Component (B') | Polybutadiene B'-1 | | | | | | 9.9 | 9.1 | |
| | Polybutadiene B'-2 | | | | | | | | 9.9 |
| Component (C) | SEBS | 14.8 | 14.8 | 14.8 | 14.8 | 14.8 | 14.8 | 14.8 | 14.8 |
| Component (D) | Spherical silica | 45.5 | 45.5 | 45.5 | 45.5 | 45.5 | 45.5 | 45.5 | 45.5 |
| Component (E) | Aluminum trisdiethylphosphinate | 5.1 | 5.1 | 5.1 | 5.1 | 5.1 | 5.1 | 5.1 | 5.1 |
| Evaluation results | Compatibility | A | B | A | B | A | D | D | B |
| | Dielectric characteristics | Dielectric constant (Dk) (at 10 GHz) | 2.8 | 2.8 | 2.8 | 2.8 | 2.8 | 2.8 | 2.9 | 3.0 |
| | | Dielectric dissipation factor (Df) (at 10 GHz) | 0.0018 | 0.0019 | 0.0020 | 0.0020 | 0.0020 | 0.0021 | 0.0023 | 0.0024 |
| | Coefficient of thermal expansion (ppm/° C.) | 75 | 70 | 66 | 70 | 73 | 83 | 80 | 75 |
| | Glass transition temperature (° C.) | 320 | 290 | 310 | 314 | 321 | 280 | 260 | 263 |

(The unit of the content is parts by mass. In the case of a solution, the unit is the content as expressed in terms of solid components.)

The respective components described in Table 2 are as follows.
[Component (A)]

Bismaleimide compound A-1: Biphenyl aralkyl type maleimide (MIR-3000, manufactured by Nippon Kayaku Co., Ltd.)

Bismaleimide compound A-2: 3,3'-Dimethyl-5,5'-diethyl-4,4'-diphenylmethane bismaleimide
[Component (B)]

Modified conjugated diene polymers B-1 to B-5: Modified conjugated diene polymers obtained in Production Examples 1 to 5
[Component (B')]

Polybutadiene B'-1: Polybutadiene b1-1 as mentioned above

Polybutadiene B'-2: Maleic anhydride-modified polybutadiene
[Component (C)]

SEBS: Styrene-ethylene-butylene-styrene copolymer
[Component (D)]

Spherical silica: Average particle diameter=0.5 μm

INDUSTRIAL APPLICABILITY

The resin composition of the present invention is favorable in compatibility, and the laminate fabricated from the foregoing resin composition is excellent especially in heat resistance and dielectric characteristics in a high frequency band of 10 GHz or higher, and therefore, it is useful as a multilayer printed wiring board to be utilized for a fifth generation mobile communication system (5G) antenna that uses radio waves in the frequency band of over 6 GHz and a millimeter wave radar that uses radio waves in the frequency band of 30 to 300 GHz.

The invention claimed is:
1. A maleimide resin composition comprising
 (A) at least one selected from the group consisting of a maleimide compound having two or more N-substituted maleimide groups and a polyaminobismaleimide compound having a structural unit derived from the maleimide compound and a structural unit derived from a diamine compound; and
 (B) a modified conjugated diene polymer, the component (B) being one resulting from modification of (b1) a conjugated diene polymer having a vinyl group in the side chain with (b2) a maleimide compound having two or more N-substituted maleimide groups, wherein a content ratio the component (A) to the component (B) [(A)/(B)] is 2.2 to 5.0 on a mass basis.

2. The maleimide resin composition according to claim 1, wherein the component (B) has, in the side chain, a substituent (x) resulting from reaction between the vinyl group which the component (b1) has and the N-substituted maleimide group which the component (b2) has.

3. The maleimide resin composition according to claim 2, wherein the substituent (x) is a group containing, as a structure derived from the component (b2), a structure represented by the following general formula (B-11) or (B-12):

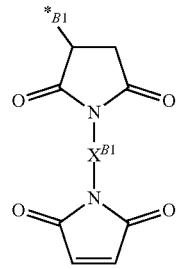
(B-11)

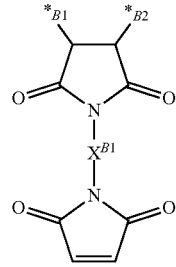
(B-12)

wherein $X^{B1}$ is a divalent organic group; $*^{B1}$ is a site binding with the carbon atom derived from the vinyl group which the component (b1) has in the side chain; and $*^{B2}$ is a site binding with other atom.

4. The maleimide resin composition according to claim 2, wherein the component (B) has the substituent (x) and a vinyl group (y) in the side chain, and a ratio of the number of the substituent (x) relative to the total number of the substituent (x) and the substituent (y) contained in one molecule [x/(x+y)] is 0.01 to 0.5.

5. The maleimide resin composition according to claim 1, wherein a number average molecular weight of the component (B) is 700 to 6,000.

6. The maleimide resin composition according to claim 1, wherein the component (b1) is a polybutadiene having a 1,2-vinyl group.

7. The maleimide resin composition according to claim 6, wherein the content of a structural unit having a 1,2-vinyl group is 50 mol % or more relative to the total structural units derived from butadiene constituting the polybutadiene having a 1,2-vinyl group.

8. The maleimide resin composition according to claim 1, wherein the component (b2) is an aromatic bismaleimide compound substituted with an aliphatic hydrocarbon group.

9. The maleimide resin composition according to claim 1, wherein a content ratio of the component (A) to the component (B) [(A)/(B)] is 2.2 to 3.5 on a mass basis.

10. A prepreg comprising the maleimide resin composition according to claim 1 or a semi-cured product of the maleimide resin composition.

11. A laminate comprising a cured product of the prepreg according to claim 10 and a metal foil.

12. A resin film comprising the maleimide resin composition according to claim 1 or a semi-cured product of the maleimide resin composition.

13. A multilayer printed wiring board comprising a cured product of the prepreg according to claim 10.

14. A semiconductor package comprising a semiconductor device having the multilayer printed wiring board according to claim 13 mounted thereon.

15. A method for producing the maleimide resin composition according to claim 1, the method comprising the following steps 1 and 2:
Step 1: a step of allowing (b1) a conjugated diene polymer having a vinyl group in the side chain and (b2) a maleimide compound having two or more N-substituted maleimide groups to react with each other, to obtain (B) a modified conjugated diene polymer; and
Step 2: a step of mixing (A) at least one selected from the group consisting of a maleimide compound having two or more N-substituted maleimide groups and a derivative thereof with the modified conjugated diene polymer (B).

16. A multilayer printed wiring board comprising the laminate according to claim 11.

17. A semiconductor package comprising a semiconductor device having the multilayer printed wiring board according to claim 16 mounted thereon.

18. A multilayer printed wiring board comprising a cured product of the resin film according to claim 12.

19. A semiconductor package comprising a semiconductor device having the multilayer printed wiring board according to claim 18 mounted thereon.

* * * * *